United States Patent

MacIver

[15] 3,648,340

[45] Mar. 14, 1972

[54] HYBRID SOLID-STATE VOLTAGE-VARIABLE TUNING CAPACITOR

[72] Inventor: Bernard A. MacIver, Lathrup Village, Mich.

[73] Assignee: General Motors Corporation, Detroit, Mich.

[22] Filed: Aug. 11, 1969

[21] Appl. No.: 848,968

[52] U.S. Cl. ..........29/25.42, 29/589, 317/234.9

[51] Int. Cl. ..........H01g 13/00

[58] Field of Search ..........29/576, 589, 590, 25.42; 317/234.9

[56] References Cited

UNITED STATES PATENTS 3,508,123 4/1970 Liles ..........317/234

3,382,568 5/1968 Kuiper ..........29/578

3,568,014 3/1971 Schwermeyer..........29/25.42 X

*Primary Examiner*—John F. Campbell

*Assistant Examiner*—Ronald J. Shore

*Attorney*—William S. Pettigrew and Robert J. Wallace

[57] ABSTRACT

A hybrid varactor including a surface varactor and a junction varactor. One form of the hybrid varactor includes the PN-junction of the junction varactor contiguous the semiconductor-insulator interface of the surface varactor. The capacitance of the device is primarily due to the space-charge depletion region associated with the semiconductor-insulator interface. The PN-junction functions primarily to prevent inversion at the semiconductor-insulator interface.

2 Claims, 2 Drawing Figures

Figure 1:
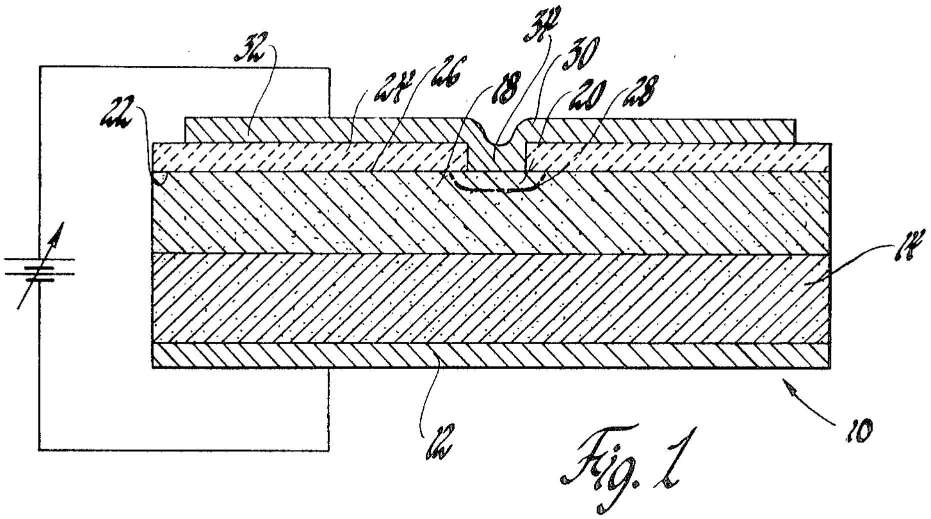

INVENTOR
Bernard R. Mac Iver
BY
R. J. Wallace
ATTORNEY

HYBRID SOLID-STATE VOLTAGE-VARIABLE TUNING CAPACITOR

This invention relates to solid-state voltage-variable capacitors and more particularly to a hybrid solid-state nonlinear voltage-variable capacitor.

Solid-state nonlinear voltage-variable capacitors both of the metal-insulator-semiconductor and PN-junction types are disclosed in the prior art. For example, metal-insulator-semiconductor voltage-variable capacitors or surface varactors as they are commonly referred to are often used in applications which require a large capacitance change. PN-junction voltage-variable capacitors on the other hand are used in amplifiers, harmonic generators and other devices wherein they are not required to generally exhibit large capacitance changes.

An illustrative application of a surface varactor would be as a tuner in an AM radio receiver. The large capacitance change generally required in radio receivers necessitates a correspondingly large voltage change. The voltage necessary to drive these surface varactors over such a capacitance range can often cause inversion of the semiconductor surface at the semiconductor-insulator interface. This inversion generally inhibits further capacitance change with increased voltage.

Means to prevent inversion at the semiconductor-insulator interface have been previously proposed in a copending application, Ser. No. 697,228, filed Jan. 11, 1968, U.S. Pat. No. 3,512,052 by MacIver et al., and assigned to the present assignee. Therein, it is proposed that a moderate resistance insulating layer of a high-permittivity dielectric be used. A sputtered layer of $Ta_2O_5$ having a thickness of about 500 to 1,500 angstroms provides such an insulating layer. The moderate resistance of the $Ta_2O_5$ layer allows a small current to flow preventing inversion. The sputtered layer of $Ta_2O_5$ is not readily adaptable to high-volume manufacture however, and pinholes therein can cause undesirable results such as excessive leakage current. Moreover, the required layer of $Ta_2O_5$ does not minimize power loss since it is of moderate resistance and therefore slightly conductive. Furthermore, the requirement of using a moderate resistance insulator substantially inhibits the selecting of an insulating material for its loss characteristics and semiconductor compatibility.

PN-junction voltage-variable capacitors or junction varactors as they are commonly referred to, generally have a capacitance maximum divided by a capacitance minimum ratio of much less than 20. Because junction varactors are not generally subject to inversion their minimum capacitance is generally much less than the minimum capacitance of a comparable surface varactor. However, their initial or 0 voltage capacitance is low. semiconductor compatibility.

A desirable varactor for certain applications such as tuners in AM radio receivers should have a high 0 voltage capacitance, be impervious to surface inversion, and have a low minimum capacitance. Accordingly, if one could combine a junction and surface varactor to provide a hybrid varactor having the above recited characteristic one would have provided a useful device.

Accordingly, a principal object of this invention is to provide a hybrid varactor which has a high 0 voltage capacitance, a low minimum capacitance and is impervious to inversion.

It is another object of this invention to provide an improved solid-state voltage-variable capacitor.

It is yet another object of this invention to provide a voltage-variable capacitor which is principally of the metal-insulator-semiconductor type wherein inversion is prevented yet the insulator may be selected for its loss characteristics and semiconductor compatibility.

It is still another object of this invention to provide a voltage-variable capacitor which is principally of the metal-insulator-semiconductor type wherein the insulated material is easily manufactured.

An important aspect of this invention is the contiguous association of a PN-junction capacitor and its corresponding space-charge depletion region with a semiconductor-insulator interface of a metal-insulator-semiconductor capacitor. Minority carriers which tend to accumulate at the semiconductor-insulator interface under reverse bias are prevented from inverting this surface by the influence of the PN-junction. The PN-junction under reverse bias sweeps the minority carriers away from the semiconductor-insulator interface.

Figure 2:
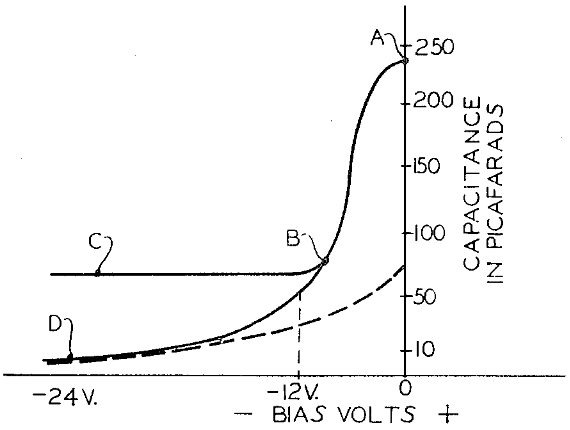

Other objects, features and advantages of the invention will become more apparent in connection with the following description of preferred examples thereof and from the drawing in which:

FIG. 1 shows a schematic diagram of a hybrid voltage-variable capacitor made in accordance with the invention; and FIG. 2 shows a series of curves illustrating the change in capacitance with applied voltage of a device made in accordance with the subject invention compared to prior art devices.

Turning now to the figures, attention is initially directed to FIG. 1 which shows schematically a variable voltage source in electrical communication with a solid-state hybrid varactor or solid-state hybrid voltage-variable capacitor. The capacitor includes a gold-plated copper electrode 12 eutectically bonded to one major surface of a low resistivity, about 0.001 ohm-cm., N-type silicon wafer 14. Wafer 14 which functions as a semiconductor substrate or epitaxial layer support is about 7 mils thick. An epitaxial layer of high-resistivity silicon, about 10 ohm-cm., is bonded to the other opposed major surface of wafer 14.

The epitaxial layer which is about 0.001 cm. thick includes an N-type region 18 and a P-type region 20 both of which extend to a major surface 22 of the layer which is spaced from wafer 14. Region 18 completely surrounds region 20 within the epitaxial layer. A silicon oxide insulator coating 24 which is about 500 angstroms thick is contiguous to and overlies N-type region 18 and a small peripheral portion of P-type region 20 on surface 22. Thus, a semiconductor-insulator interface 26 and a PN-junction 28 exists contiguously at surface 22.

An aluminum counterelectrode 30 has a major portion 32 overlying region 18 being spaced therefrom by silicon oxide insulator coating 24. Counterelectrode 30 also has a minor portion 34 engaging the central portion of region 20 that is not covered by coating 24 which is substantially all of the surface area of region 20, making electrical contact thereto. The area of counterelectrode 30 or major portion 32 that overlies coating 24 is about 0.0035 $cm.^2$. The area of counterelectrode 30 or minor portion 34 that engages P-type region 20 is about 0.00016 $cm.^2$ which is substantially the surface area of P-type region 20. Thus, the metal-insulator interface has a surface area of about 22 times the P-type-metal region interface surface area.

In order to make capacitor 10 a 0.001 ohm-cm. N-type silicon wafer about 7 mils thick was lapped, polished, and cleaned. An epitaxial layer about 0.001 cm. thick, of 10 ohm-cm. N-type silicon was then epitaxially deposited on a major surface of wafer 12 in one of the normal and accepted manners.

The techniques used to form region 18 and region 20 within the layer were conventional and well known. They included forming a silicon oxide coating about 500 angstroms thick upon major surface 22 of the layer. A window was then etched in the silicon oxide coating using well-known photoetch techniques to expose a preselected area of surface 22. Aluminum counterelectrode 30 was then deposited onto coating 24 and alloyed at about 600° C. to the exposed preselected area of surface 22. In alloying counterelectrode 30 to surface 22 P-type impurities diffused therein forming P-type region 20 and PN-junction 28 within the epitaxial layer. Electrode 12 was eutectically bonded to wafer 14 at about 400° C. in the normal and accepted manner.

The operation of capacitor 10 can best be understood by reference to FIGS. 1 and 2. FIG. 2 shows a graph in which reverse bias voltage over a range from 0 to −24 volts is plotted as the abscissa with capacitance in picofarads plotted as the ordinate. The curve formed by a series of dashes represents the change in capacitance with voltage of a junction varactor especially designed for a variation in capacitance with an applied voltage. The curve formed through the points designated A, B and C show the change in capacitance of a surface varactor having a 500 angstrom silicon oxide insulator coating made in accordance with the prior art. The curve formed through the points designated A, B and D shows the change in capacitance of a hybrid varactor having a 500 angstrom silicon oxide insulator coating made substantially in accordance with the foregoing described method.

As can be seen from the curves depicted in FIG. 2, the junction varactor provides generally a continuing change in capacitance with applied voltage. However, the initial capacitance of the junction varactor is relatively low, herein less than 100 picofarads at 0 volts. The surface varactor made in accordance with the prior art has initially a relatively high capacitance, about 250 picofarads at 0 volts. Its capacitance then changes relatively rapidly with increased negative voltage until a capacitance of about 100 picofarads is reached. At that point which represents approximately −12 volts of reverse bias little capacitance change is noted with further increased bias voltage. On the other hand, the hybrid varactor made substantially in accordance with the foregoing described methods has a continually decreasing capacitance over a voltage range of about 0 volts to about −24 volts of negative bias. Moreover, the hybrid varactor has a relatively high 0 voltage capacitance of about 250 picofarads and a relatively low capacitance at −24 volts of about 12 picofarads.

Although the mechanism of inversion at the insulator-semiconductor interface may not be completely understood, certain aspects of it are generally explainable. Under reverse bias, counterelectrode 30 negative with respect to electrode 12, electrons are driven away from semiconductor-insulator interface 26 leaving immobile ionized donors at surface 22. This creates a depletion region within the epitaxial layer whose depth therein is a function of the applied bias voltage. This depletion region and its depth gives rise, as is well understood in the art, to a capacitance which is essentially in series with the inherent or 0 voltage capacitance of capacitor 10. Positive holes drift toward interface 26 under the influence of the electric field associated with the reverse bias voltage. When the density of holes exceeds the density of the ionized donors at surface 22 it is then inverted. Further capacitance change with increased reverse bias is greatly inhibited because the positive holes essentially equalize any additional negative charge placed on the adjacent counterelectrode 30.

What I have disclosed then is a hybrid varactor which is principally of the surface varactor type wherein inversion at the semiconductor-insulator interface is substantially prevented. I use a junction varactor which includes a PN-junction herein designated junction 28 which is contiguous to semiconductor-insulator interface 26. Positive holes entering the space-charge region associated with PN-junction 28 are swept out of N-type region 18 including surface 22 into P-type region 20. This prevents the positive holes from accumulating at surface 22 in sufficient numbers to invert that surface.

An important aspect of this invention is the synergistic association of PN-junction 28 and semiconductor-insulator interface 26. PN-junction 28 essentially provides a parallel capacitance path to the capacitance associated with interface 26. Accordingly, one might expect an effective capacitance which is much greater than one obtains from a conventionally constructed surface varactor. However, I have found that with a proper ratio of the surface area of counterelectrode 30 overlying insulator 24 to the surface area of P-type region 18 that the resultant capacitance is not appreciably increased. What has been found, specifically, is that the capacitance associated with the reverse bias PN-junction 28 is essentially negligible from about 0 to about −12 volts of reverse bias. On the other hand, as the bias voltage is increased, the capacitance approaches the capacitance one might expect of a junction capacitor at the same voltage. However, this capacitance is still generally due to the depletion space-charge associated with semiconductor-insulator interface 26.

Another important aspect of this invention is that the effect of pinholes which often appear in relatively thin insulator coatings, less than several thousand angstroms, is minimized. During the formation of P-type region 18 by the alloying of counterelectrode 30, small PN-junctions would be formed under any pinholes existing in the insulator. These junctions so formed would tend to aid PN-junction 28 in inhibiting surface inversion.

It should be understood that although the disclosed preferred embodiment used about a 500 angstrom layer of silicon oxide as its insulator this invention is not to be so limited. As is well known, dielectric thickness is related to the desired capacitance requirements.

It is also to be understood that other insulating materials having favorable mechanical, thermal and electrical characteristics which are compatible with semiconductors may be used. For example, alumina which has a high bulk resistivity of at least about $10^{11}$ ohm-cm., a dielectric constant of about 12 and a coefficient of expansion similar to silicon may be used in varying thicknesses. Moreover, composite layers having a thin layer, about 100 to 200 angstroms, of silicon oxide or alumina contiguous the semiconductor surface and overlying relatively thick layers, several thousand angstroms, of either $Nb_2O_5$, $Ta_2O_5$ and $TiO_2$ could be used. This would allow one to further optimize the insulator's dielectric constant, its resistivity, and its semiconductor compatibility. For example, $Ta_2O_5$ has a dielectric constant of about 26 yet its resistivity is only about $10^8$. Silicon dioxide has a resistivity of about $10^{12}$ and a dielectric constant of about 3.

It should further be understood that although wafer 14 was described having a resistivity of about 0.001 ohm-cm. and a thickness of about 7 mils no critical limitations were thereby implied. However, a resistivity of less than 0.001 ohm-cm. could hinder the deposition of the epitaxial layer, and a resistivity of a higher than 0.015 ohm-cm. could introduce too high a series resistance. The thickness of wafer 14 should be however about 5 to 10 mils. If wafer 14 is less than 5 mils it could be difficult to handle during processing. On the other hand, a wafer thickness of greater than 10 mils could provide too high a series resistance in the capacitor and should be avoided. Likewise, although the epitaxial layer was described as having a resistivity of about 10 ohm-cm. and a thickness of about 0.003 cm. no limitations are to be implied. The thickness of the layer should be greater than the largest expected depth of the depletion region, yet not too thick to introduce unwanted losses. A useful thickness range has been found to be about 0.004 cm. to about 0.00005 cm. The resistivity of the layer should be at least about 10 ohm-cm. to expect reasonable capacitance variations with voltage, and less than 50 ohm-cm. to minimize dissipation-type losses.

It should also be understood that although the semiconductor wafer and epitaxial layer has been set forth in the preferred embodiment as being N-type silicon, other semiconductive materials and the opposite type conductivity may be used. For example, the herein disclosed concepts may easily be applied to germanium. However, silicon is preferred. Moreover, a P-type wafer and epitaxial layer may also be used. However, for certain applications, an N-type wafer and epitaxial layer are preferred.

As was previously pointed out, an important aspect of this invention is the ratio of the surface area of the counterelectrode overlying the insulator coating to the surface area of the P-type region, or essentially the area enclosed by the PN-junction. Although the herein described preferred embodiment utilizes an area ratio of about 22:1, the invention is not to be so limited. The surface area enclosed by the PN-junction should be small enough such that the capacitance effect of the PN-junction is minimized at low bias voltage and large enough to prevent inversion at high voltage. It has been found that with an area ratio of less than about 10:1 the capacitance effect of the PN-junction is not minimal at low voltage. On the other hand, an area ratio of more than about 100:1 can produce unsatisfactory results. For example, current across the PN-junction may be insufficient to prevent inversion at the metal-insulator interface. This current can be limited by spreading resistance or resistance parallel to the metal-insulator interface if insufficient diode area is not provided. Moreover, the resistance in that part of the counterelectrode engaging the diode can materially reduce this current. For most device applications the surface area of the diode should be at least about $10^{-5}$ cm.$^2$ in order to insure that a low-resistance contact can be made thereto.

It should, moreover, be understood that although one region of the diode as herein described was formed by alloying an electrode thereto, other means may be used. For example, this region can be formed using the normal and accepted vapor diffusion oxide masking techniques. This would include forming silicon oxide on surface 22, etching a window therein to expose a preselected area of this surface and diffusing conductivity-type determining impurities therein forming region 20. The counterelectrode would then be ohmically bonded to region 20.

Although the present invention has been described with respect to specific details of certain embodiments thereof, it is not intended that such details be limitations upon the scope of the invention except so far as set forth in the following recitation.

I claim:

1. A method of making a hybrid varactor which comprises:

epitaxially depositing a high-resistivity layer of semiconductive material on a low-resistivity semiconductive wafer of the same conductivity type;

coating the surface of said epitaxial layer with an insulating material;

etching through said coating to expose a preselected area of said epitaxial layer;

forming on said insulating coating and said preselected area a counterelectrode containing P-type impurity metal;

alloying said counterelectrode to form a PN-junction with said preselected area and with any other epitaxial areas exposed through pinholes in said insulating coating; and attaching an electrode to said wafer on a surface spaced from said layer.

2. A method of making a hybrid varactor which comprises:

epitaxially depositing a high-resistivity layer of semiconductive material on a low-resistivity semiconductive wafer of the same conductivity type;

coating the surface of said epitaxial layer with a thin layer of silicon oxide;

coating the silicon oxide layer with a thicker layer of an oxide selected from the group consisting of $Nb_2O_5$, $Ta_2O_5$ and $TiO_2$;

etching through said oxide layers to expose a preselected area of said epitaxial layer;

forming a PN-junction within said preselected area;

applying a counterelectrode to said preselected area and the surrounding oxide layers; and attaching an electrode to said wafer on a surface spaced from said layers.

* * * * *